US005486800A

United States Patent [19]
Davenport

[11] Patent Number: 5,486,800
[45] Date of Patent: Jan. 23, 1996

[54] SURFACE ACOUSTIC WAVE DEVICE

[75] Inventor: Roger A. Davenport, Ft. Lauderdale, Fla.

[73] Assignee: Motorola, Inc., Schaumburg, Ill.

[21] Appl. No.: 314,835

[22] Filed: Sep. 29, 1994

[51] Int. Cl.⁶ ..................................... H03H 9/64
[52] U.S. Cl. .............. 333/193; 333/195; 310/313 R
[58] Field of Search .................. 333/193, 194, 333/195, 196; 310/313 R, 313 B, 313 C, 313 D

[56] References Cited

U.S. PATENT DOCUMENTS

| | | | |
|---|---|---|---|
| 3,689,784 | 9/1972 | DeKlerk | 310/9.8 |
| 3,760,204 | 9/1973 | Yester, Jr. | 310/8.2 |
| 3,825,779 | 7/1974 | deKlerk | 310/9.8 |
| 3,970,970 | 7/1976 | Worley | 333/72 |
| 4,166,258 | 8/1979 | Tseng | 333/195 |
| 4,223,284 | 9/1980 | Inoue et al. | 333/150 |
| 4,409,567 | 10/1983 | Setsune et al. | 333/151 |
| 4,491,811 | 1/1985 | Niitsuma et al. | 333/151 |
| 4,954,795 | 9/1990 | Choi | 333/194 |
| 5,115,216 | 5/1992 | Hikita et al. | 333/195 |
| 5,202,652 | 4/1993 | Tabuchi et al. | 333/193 |
| 5,296,824 | 3/1994 | Cho et al. | 333/193 |

*Primary Examiner*—Benny Lee
*Assistant Examiner*—David H. Vu
*Attorney, Agent, or Firm*—Barbara R. Doutre

[57] ABSTRACT

A surface acoustic wave (SAW) device (300) comprising interdigital transducers (302, 304, 306) combined on acoustic tracks (308, 310). Resonant interdigital transducers (302, 304) are electrically and acoustically coupled in series on a common acoustic track (308) while anti resonant transducer (306) is electrically coupled to the series connection and located on the second acoustic track (310).

20 Claims, 6 Drawing Sheets

SURFACE ACOUSTIC WAVE DEVICE

TECHNICAL FIELD

This invention relates in general to surface acoustic wave devices (SAWs).

BACKGROUND

Surface acoustic wave (SAW) devices use waves propagated on the surface of an elastic solid for electronic signal processing. A typical SAW device uses a transducer to convert electromagnetic signal waves, which travel at the speed of light, to acoustic signal waves, which travel at speeds on the order of $10^5$ less than the speed of light. This substantial reduction in wave length allows designers to implement certain complex signaling processing functions in a significantly smaller space than would be needed for traditional circuit designs. Thus, a SAW device designed to handle complex signal processing functions can offer considerable cost and size advantages over competing technologies. SAW technology is increasingly found in applications such as filters, resonators, oscillators, delay lines, and other similar devices.

SAW devices are typically implemented on a piezoelectric substrate and usually employ interdigital transducers (IDTs) located on the surface of the piezoelectric substrate to generate and detect acoustic waves. The geometry of the IDTs (beam width, pitch, number of fingers) on the piezoelectric substrate plays a significant role in the signal processing and frequency response characteristics of a SAW device. SAW device designers generally achieve the desired operating frequency response of the device by focusing on the geometry of the IDTs, and by the choice of materials used for the piezoelectric substrate.

Conventional SAW filters have transducers located side by side on common tracks and use acoustic coupling to couple between the transducers, however, each acoustic track must be tuned for the same resonant operating frequency. Historically, SAW devices have had problems with insertion loss with a typical insertion loss for SAW filters being greater than 3.5 dB. One of the large loss mechanisms in today's high coupling coefficient SAW filters is the acoustic wave attenuation. The acoustic attenuation is the amount of energy lost or converted into unrecoverable bulk energy as the surface wave propagates along the surface of the piezoelectric substrate.

An improvement over the conventional SAW filter is the SAW ladder filter. Conventional SAW ladder filters are differentiated from conventional non-ladder SAW filters in that the transducers in the ladder design are acoustically staggered, use only electrical coupling, and operate at different frequencies (resonant and anti resonant) at a center frequency $f_o$.

Figure 1:
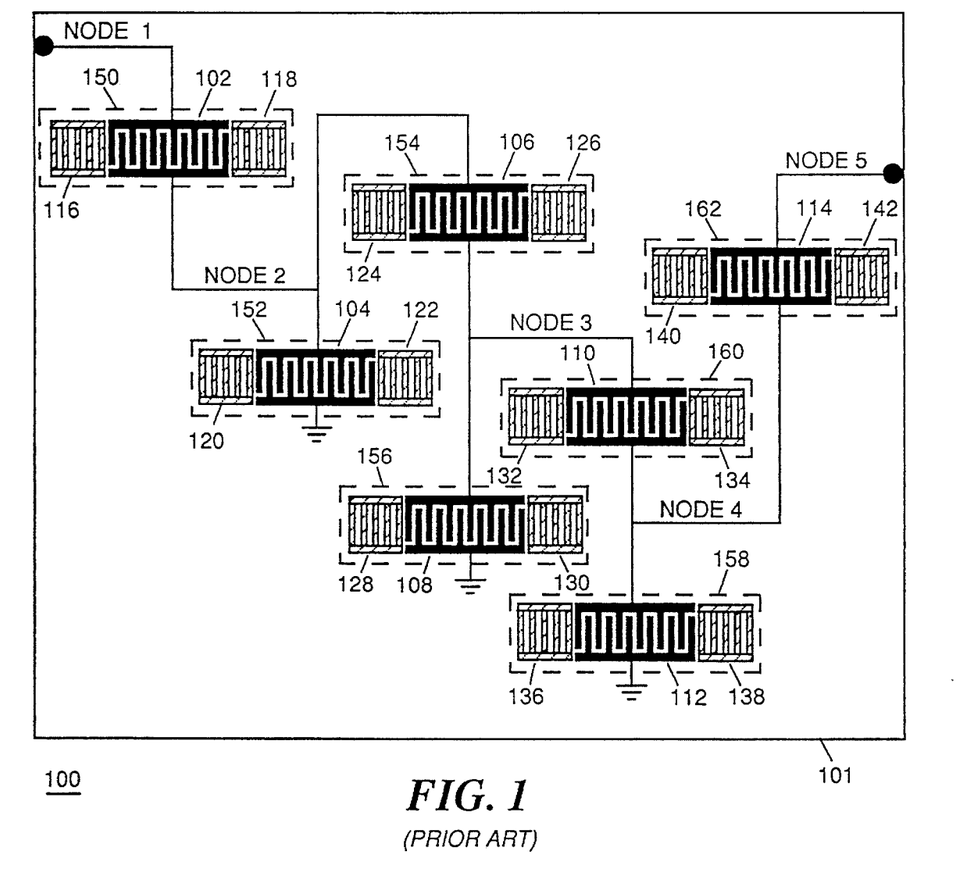
FIG. 1 shows a prior art SAW ladder filter.
Figure 2:
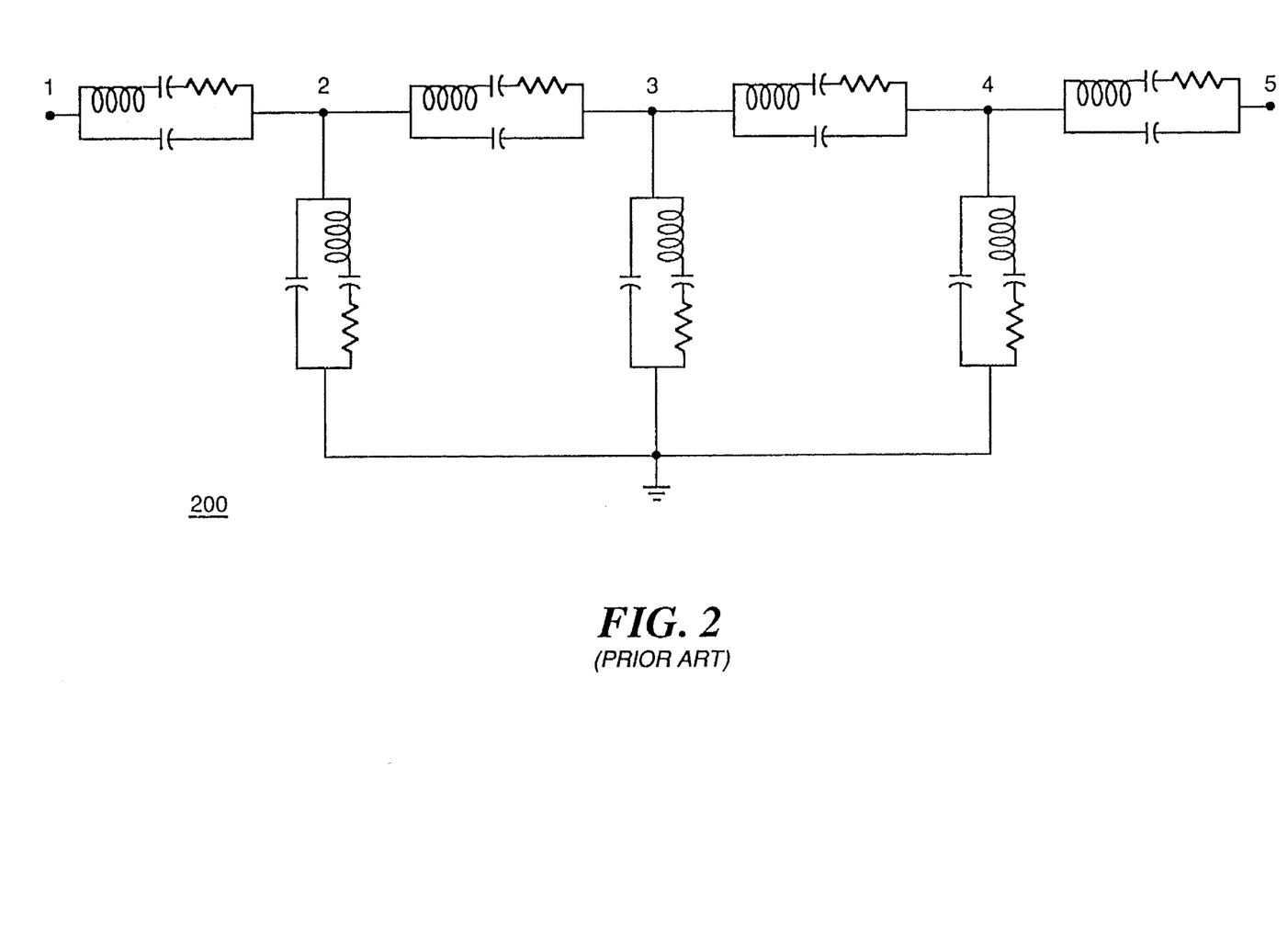

Referring now to FIGS. 1 and 2 of the accompanying drawings there is shown a prior art SAW ladder filter 100 and its' associated equivalent circuit model 200. The filter 100 includes 7 resonators 150–162 located on 7 separate acoustic tracks of a piezoelectric substrate 101. Each resonator 150-162 is comprised of a transducer 102–114 and two reflectors 116–142. The resonators 150–162 are electrically coupled through their respective transducers at nodes 1 to 5. Conventional SAW ladder filter designs have their acoustic paths in different propagation paths so the acoustic energy leaving the end of a transducer does not interfere with the response of another transducer. These SAW ladder filters can be designed with and without the reflectors. However, the acoustic energy leaving the transducer in a non-reflector design generally creates a large loss mechanism in the filter.

The purpose of the reflector is to conserve the energy being lost out the ends of the transducer by reflecting the acoustic energy back into the transducer which increases the resonator's unloaded Q ($Q_u$). The reflector, however, is not an ideal device, as acoustic energy is lost in the reflector. The energy lost in the reflector is due to the acoustic attenuation of the surface wave as it travels into the reflector and then back out. The acoustic attenuation has two components. The first component being gradual conversion of the surface mode to bulk mode as it travels on the uniform surface. The second component being the acoustic scattering that takes place when a surface wave hits a discontinuity, such as the reflector fingers. The entire time the surface wave is in the reflector, no energy is being utilized by the transducer, and consequently, the reflector loss degrades the filter insertion loss.

While an improvement over conventional non ladder filters, the typical insertion loss for ladder filter devices is still greater than 2.5 dB. A drawback to conventional SAW ladder designs is a strict impedance requirement which forces narrow constraints on the beam width and pitch of the individual transducers. Also, SAW ladder filters have historically needed a large surface area for implementation because of the separation of all the transducers and the additional reflectors.

Hence, there is a need for an improved SAW device that minimizes acoustic losses and provides improved filter performance, particularly with regards to insertion loss, while reducing the surface area required in order to be implemented.

BRIEF DESCRIPTION OF THE DRAWINGS

FIG. 2 shows an equivalent circuit model for the SAW ladder filter of

DETAILED DESCRIPTION OF THE PREFERRED EMBODIMENT

Figure 3:
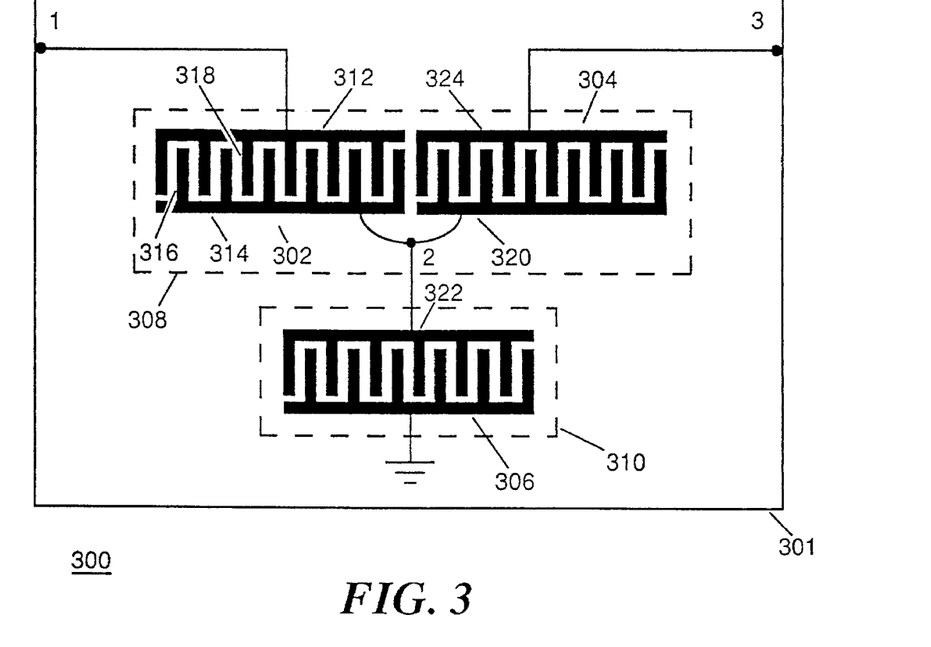
FIG. 3 shows a SAW device in accordance with the present invention.
Figure 4:
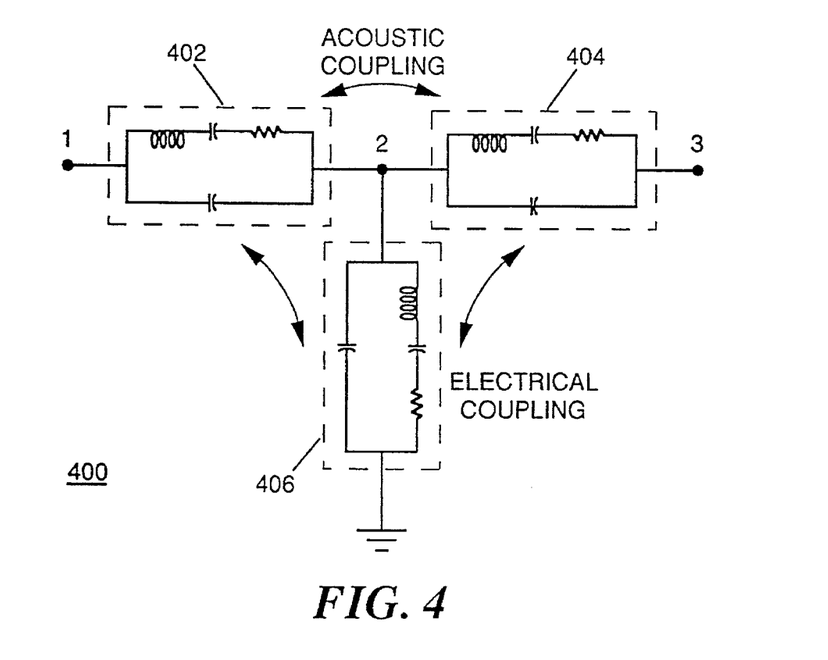
FIG. 4 shows the equivalent; circuit model for the SAW device of FIG. 3.

Referring now to FIGS. 3 and 4 of the accompanying drawings, there is shown a SAW device 300 and its associated equivalent circuit model 400 in accordance with the present invention. FIG. 3 shows a T network, deposited on a piezoelectric substrate 301, consisting of two series transducers 302, 304 combined on a common acoustic track 308 and a shunt transducer 306 on a second acoustic track 310 with interconnecting nodes labeled 1, 2, and 3. Series transducers 302, 304 operate at resonance at a frequency $f_o$, while the shunt transducer 306 operates at anti resonance at the frequency $f_o$, where $f_o$ is the target center of a frequency passband. Each transducer element is comprised of first and second opposite electrode bus bars 312 and 314 and includes electrode fingers 316 and 318 extending from each of said first and second opposite electrodes bus bars. Electrode bus bars will also be referred to simply as electrodes. The electrode fingers 316, 318 extend from the opposing electrodes 312, 314 such that they are interdigitated. The electrical coupling between the two adjacent transducers 302, 304 is formed by electrically connecting (e.g. through wire bonding or patterned metal) electrode 314 of the first transducer with electrode 320 of the second transducer, further electrical coupling is controlled by shunt transducer 306 connected at electrode 322. Acoustical coupling is thus formed between adjacent transducers 302 and 304 on the common acoustic track 308. The series transducers 302, 304 can be separated by a substantially ¼ λ (wavelength) space or other acoustic length for control of the acoustic phase relation between the acoustically adjacent transducers.

As previously mentioned, the transducers 302 and 304 combined on the common acoustic track 308 are tuned to operate at resonance at $f_o$ while the shunt transducer is tuned for anti resonance at $f_o$. The acoustic coupling between the series transducers 302, 304 on the common acoustic track 308 allows the electrode fingers 316, 318 to have substantially the same beam width and pitch making them easily manufacturable. The pitch determines the frequency of operation of a given transducer and is defined as the finger width added to the space between fingers. The beam width determines the amount of acoustic coupling between adjacent transducers and is defined as the spacing between, but not including, the electrode bus bars 312, 314. The fact that the SAW device of FIG. 3 combines transducers on common acoustic tracks with the two tracks operating at different frequencies provides the advantage of having acoustic coupling and electrical coupling but without the disadvantage of having to stager the transducers to isolate them.

The equivalent circuit model of FIG. 4 includes impedance elements 402, 404, 406 which correspond transducers 302, 304, and 306 of FIG. 3 respectively. Electrical and acoustical coupling are formed between impedance elements 402 and 404 while electrical coupling is formed using impedance element 406 to both impedance elements 402 and 404. The same equivalent circuit is achieved if the electrical coupling of FIG. 3 were accomplished by connecting the electrode 314 to the opposite electrode 324 and the output were taken from electrode 320.

Transducer impedance depends on static capacitance ($C_o$) between electrode fingers and the substrate parameters. The acoustic coupling between adjacent transducers depends on the amount of acoustic energy which is shared by the two coupled adjacent transducers. The acoustic energy excited near the end of the transducer is the only acoustic energy which is capable of exiting the transducer to be shared by another transducer. For high coupling coefficient materials the internal reflections are large, causing a high percentage of the total energy to be trapped within the resonant transducer. The acoustic coupling can be adjusted independently of the electrical coupling by trading the beam width for the number of fingers in the transducer, keeping $C_o$ constant. This additional adjustable coupling can be used to limit the impedance level swings in the SAW device 300 and ultimately provides flexibility in the tuning of devices that implement the SAW device 300.

Figure 5:
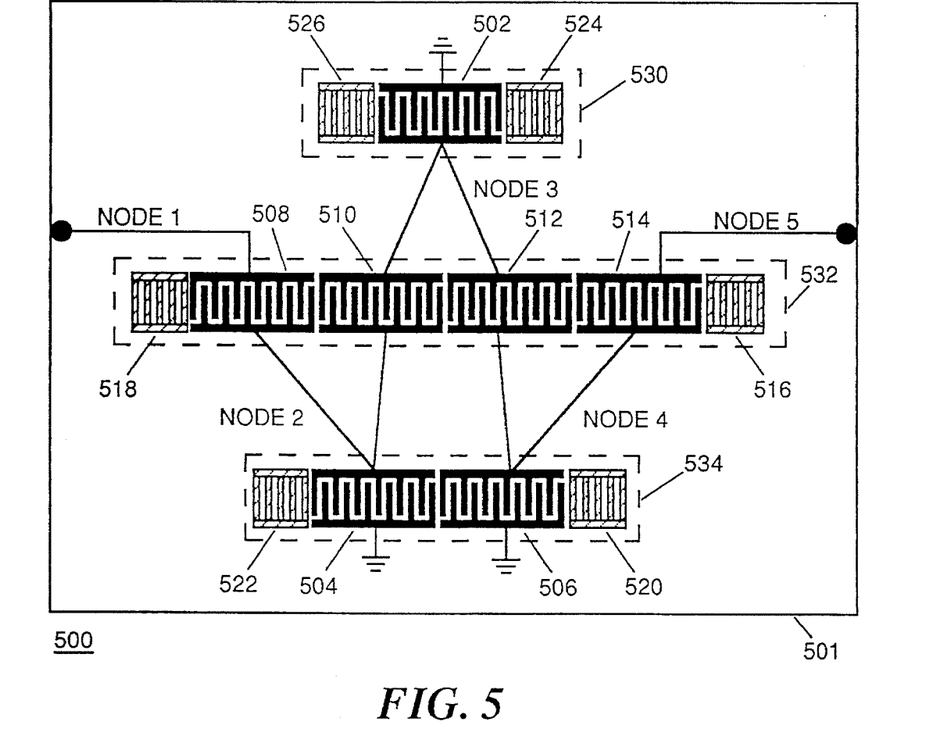
FIG. 5 shows a SAW filter in accordance with the present invention.

In a second embodiment of the invention shown in FIG. 5, a three track filter 500 is designed using a variation on the SAW device shown in FIG. 3. The three track acoustic filter consists of three shunt transducers 502, 504, and 506 four series transducers 508, 510, 512, and 514, and six reflectors 516 though 526 deposited on a piezoelectric substrate 501.

The nodes are similarly numbered to the nodes of FIG. 1, nodes 1 to 5 and the equivalent circuit model is the same as that of FIG. 2. The number of acoustic tracks in the prior art filter are now reduced from seven to three and also the number of reflectors as compared to the prior art is reduced from 14 to 6. To accomplish this, the like transducers of the prior art ladder design of FIG. 1 are combined into three acoustic tracks 530, 532, 534. While referring to the transducers of FIG. 5, the first electrode will be considered the top electrode of the transducer and the second electrode will be considered the bottom electrode, for the purpose of describing the interconnections between the transducers. The input of filter 500 is connected to the first electrode of transducer 508 (node 1) and the output of the filter is connected to the first electrode of transducer 514 (node 5). Electrical coupling between transducers 508 and 510 is formed by connecting their second electrodes with the first electrode of shunt transducer 504 (node 2). The first electrodes of transducers 510 and 512 are electrically coupled to the second electrode of shunt transducer 502 (node 3). The second electrodes of transducers 512 and 514 are electrically coupled to the first electrode of shunt transducer 506 (node 4). Acoustical coupling then occurs between series transducers on common tracks, in this case on track 532 only. The transducers combined in series on acoustic track 532 are tuned to operate at resonant frequency while the transducers on tracks 530 and 534 are tuned for to operate at anti resonant frequency. The additional acoustic coupling allows the beam and pitch of the electrode fingers to be identical on a common acoustic track.

The electrical connections for the transducers made at nodes 1 through 5 are preferably implemented using patterned metallization on the piezoelectric substrate, however other techniques such as wire bonding or flip chip could be used as well. Simulated response for the three track filter has shown a 1.7 dB insertion loss and a 3 dB bandwidth of 42 megahertz (MHz) using a 64 LiNbO$_3$.

The three track filter design as described by the invention, takes advantage of the acoustical coupling that occurs when transducers share an acoustic track. This extra coupling reduces the strict impedance requirement of the conventional SAW device and allows flexibility in the design of the beam width and pitch of the transducers. Another advantage of the combined three track invention is that it also reduces the required number of different transducer pitches from 4 to 3.

Figure 6:
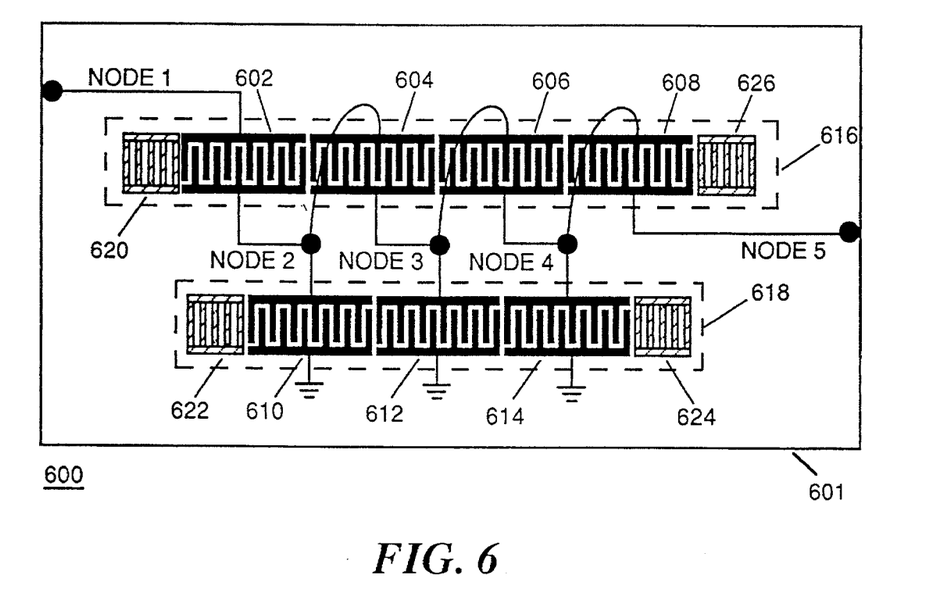
FIG. 6 shows another SAW filter in accordance with the present invention.

A second embodiment of the invention is shown in FIG. 6 where the number of acoustic tracks is further reduced from three down to two. The SAW filter 600 comprises four series interdigital transducers 602, 604, 606, 608 and three shunt interdigital transducers 610, 612, 614 deposited on a piezoelectric substrate 601 in two acoustic paths 616, 618. For the purposes of describing the electrical interconnections between transducers each transducer is said to include first and second electrodes with the first electrode being the top electrode and the second electrode being the bottom electrode. The input to the filter 600 is connected to the first electrode of transducer 602 (node 1) while the output of the filter is connected to the second electrode of transducer 608 (node 5). The electrical coupling between transducers is accomplished by connecting (e.g. through wire bonding or other means) the second electrode of transducer 602 to the first electrode of the adjacent transducer 604 and also coupling to the first electrode of shunt transducer 610 (node 2) forming a T-network similar to the SAW device of FIG. 3. The second electrode of transducer 604 is connected to the first electrode of transducer 606 and also to the first electrode of transducer 612 (node 3). The second electrode of transducer 606 is connected to the first electrode of transducer 608 and to the first electrode of transducer 614 (node 4). The second electrodes of transducers 610, 612, and 614 are all connected to ground potential. Reflectors 620–626 are acoustically coupled to the end transducers 602, 608, 610 and 614 on the acoustic tracks 616 and 618 to capture and reflect the acoustic energy from the end transducers. The two track filter takes advantage of acoustic coupling as well as the electrical coupling to provide a filter with the same equivalent circuit as that of the prior art filter shown FIGS. 1 and 2, but with fewer tracks and fewer reflectors.

The transducers in the same acoustic path achieve coherent acoustic energy transfer or partial acoustic transfer from the ends of adjacent transducers by adding acoustic energy in phase (synchronous transfer) or partially canceling acoustic energy out of phase (non synchronous transfer). The two track filter, as described by the invention, has only four reflectors which reduces the acoustic losses and minimizes the insertion loss of the filter. The benefits of the two track SAW filter as described by the invention include complimentary acoustic coupling between each resonator pair thus allowing the pitch and beam width for all series transducers to be the same and all parallel transducers to be the same. Only two pitches and two beam widths are required per filter device in the two track design, thus simplifying manufacturing processes.

The two track filter 600 differs from the three track 500 in that the two track acoustical coupling takes place only at those points where electrical coupling is required. This is true for shunt and series transducers. While shown and described with reflectors at the ends of the common acoustic tracks, the SAW filters 500 and 600 could also be designed without the reflectors, taking into account the acoustic energy being lost at the ends of the tracks.

Figure 7:
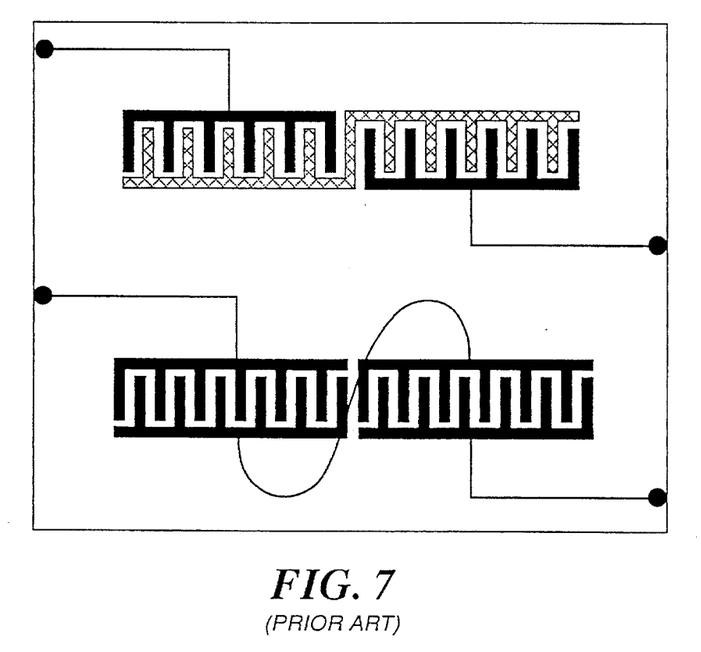
FIG. 7 shows a prior art SAW twisted pair configuration.
Figure 8:
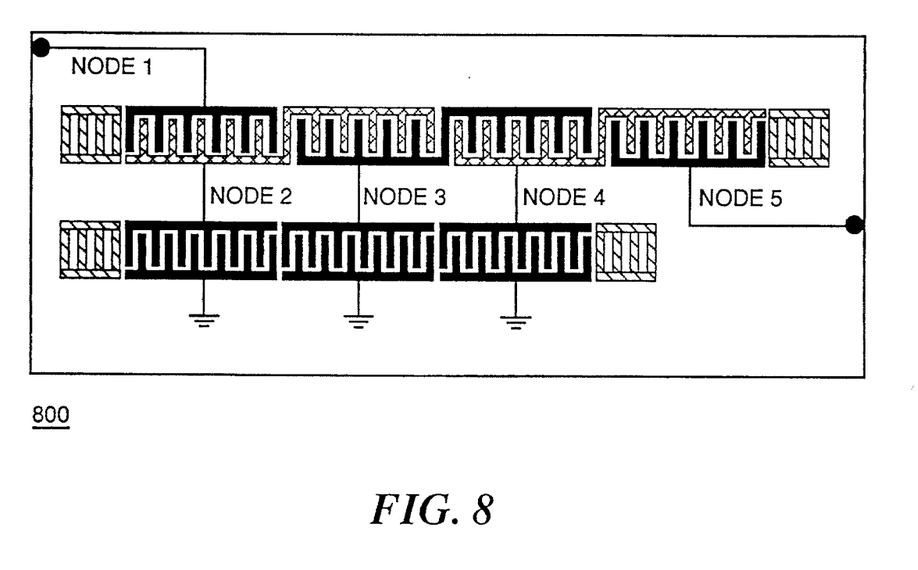
FIG. 8 shows yet another SAW filter in accordance with the present invention.

When the shunt transducers for the two track filter 600 are combined into a common acoustic track, the electrical connection from the individual series transducers are required to cross the acoustic path 616. This connection can also be accomplished by combining the metallization pattern of an electrode finger of one transducer to an opposite electrode finger of the next adjacent transducer. This is shown in FIG. 8 of the accompanying drawings and can be accomplished by using a variation of a prior art transducer pair shown in FIG. 7. The prior art transducer pair basically interconnects like transducers by connecting the last electrode finger of a transducer to the first electrode finger of the adjacent transducer using a ¾ λ (wavelength) width while all other electrode fingers remain at ¼ λ.

The two track filter of FIG. 8 uses similar electrical and acoustical coupling between the series transducers, however the shunt transducers provide the remainder of the electrical connection for the T network and also provide acoustical coupling between adjacent shunt transducers. In the filter 800, series transducers are electrically and acoustically coupled and are operating at resonant frequency while the shunt transducers are acoustically coupled and operating at anti resonant frequency. The use of acoustical coupling on a common acoustic track allows one acoustic track to operate at resonance while the other acoustic track operates at anti resonance. The two track filter as described in FIG. 8 allows for an ultra low loss filter to be implemented as shown, in a single plain. The two track ladder filter as described in both FIGS. 6 and 8 allows the acoustic and electrical coupling to work together between transducers.

By combining like transducers onto common acoustic tracks and reducing the number of reflectors with their associated losses, the overall insertion loss of a SAW filter is decreased. Simulated data, using 64 degree $LiNbO_3$ which has a coupling coefficient, $k^2$, of 11%, has shown that high performance low loss filters with an insertion loss of approximately 1.7 dB at 850 MHz with a 3 dB bandwidth of 42 MHz can be achieved with the two track design. Even wider bandwidth filters are achievable with higher coupling coefficient materials such as 41 degree $LiNbO_3$. Experimental data has shown that SAW filters designed with the three track implementation, as described by the invention, using a substrate of 41 degree $LiNbO_3$ have an insertion loss of less than 2 dB with an increased 3 dB fractional bandwidth of 9.5% and 33 dB out of band rejection.

The longer the transducer, the smaller the percent of total acoustic energy gets coupled to the adjacent transducers. Therefore, the two and three track designs as described by the invention, allow two forms of coupling between resonant transducers, acoustic and electrical. This extra degree of coupling freedom allows the series transducers to be designed with the same finger pitch and the same beam width which is advantageous from a manufacturing point of view. Shunt transducers located on a common acoustic track can also be designed to have the same finger pitch and the same beam width across the common track. As previously mentioned, the acoustic coupling can be adjusted independently of the electrical coupling by trading the beam width for the number of fingers in a transducer.

Figure 9:
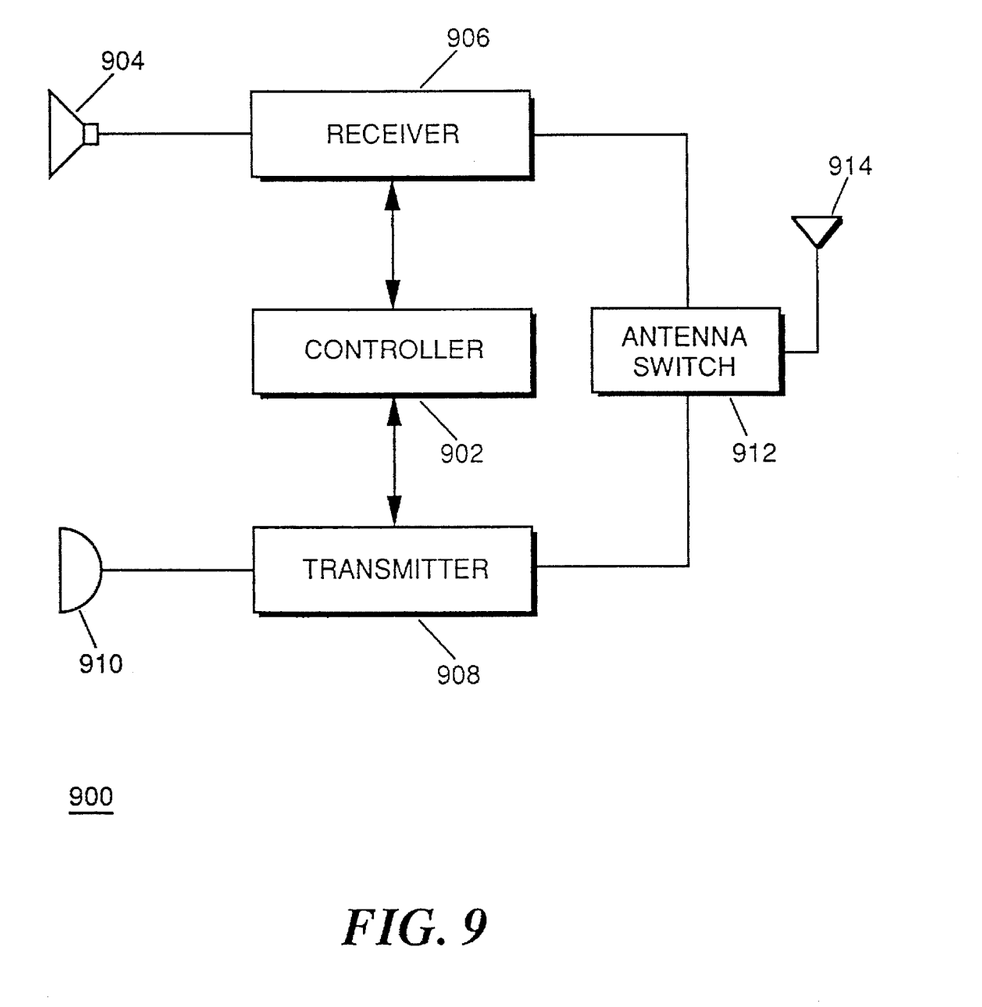
FIG. 9 shows a radio block diagram in accordance with the present invention.

Referring now to FIG. 9, a block diagram of a communication device, such as a portable two-way radio 900, which uses the SAW device as described by the invention is shown. Radio 900 comprises a transmitter 906 and receiver 908 which are selectively coupled to antenna 914 via antenna switch 12 which can take the form of a conventional antenna switch or a duplexer. Receiver 906 and transmitter 908 are under the control of controller 902 which stores and executes control software.

A speaker 904 is coupled to receiver 906 in order to provide audio to be presented to the radio user. While microphone 910 is coupled to transmitter 908 in order to convert the users voice into electrical signals usable to transmitter 908. The present invention contemplates utilizing SAW technology for the processing of communication signals.

In receiver 906, the received signal is applied to a filter (not shown) which comprises a SAW bandpass filter utilizing a topology such as described by the present invention in order to provide the selectivity for receiver 906. Although described as being used in the receiver, the SAW filter as described by the invention could be used in the transmitter chain as well.

By acoustically coupling like transducers on common acoustic tracks, the number of reflectors is reduced along with their associated losses while at the same time efficiently utilizing the otherwise lost acoustic energy between transducers. The result is a SAW device that can be used as a filter to provide a lower insertion loss than conventional ladder or non-ladder SAW filters. Wider bandwidths filters can be achieved with greater tuning flexibility with the addition of the acoustic coupling as described by the invention. A further benefit of the SAW device, as described by the invention, is that the surface area required on the piezoelectric substrate is reduced due to the reduction of the number of reflectors and the elimination of the need for staggering the transducers.

What is claimed is:

1. A surface acoustic wave (SAW) device operating over a passband having a center frequency, comprising:
   a piezoelectric substrate having at least two acoustic tracks;
   at least two interdigital transducers located on one acoustic track, operating at resonance at the center frequency;
   at least one interdigital transducer located on a second acoustic track, operating at anti resonance at the center frequency;
   the at least two interdigital transducers on the one acoustic track are acoustically and electrically coupled and the at least one interdigital transducer on the second acoustic track is electrically coupled to the at least two interdigital transducers on the one acoustic track; and
   the at least two interdigital transducers on the one acoustic track are tuned for resonance at the center frequency using independently adjustable electrical and acoustic coupling while the at least one interdigital shunt transducer on the second acoustic track is tuned for anti resonance at the center frequency using independently controlled electrical coupling.

2. A SAW device as described in claim 1, wherein the interdigital transducers operating at resonance are electrically and acoustically coupled in series.

3. A SAW device as described in claim 2, wherein the interdigital transducers operating at anti resonance are electrically coupled between the series connected resonant transducers and ground potential.

4. A surface acoustic wave (SAW) device operating over a frequency passband having a center frequency $f_o$, comprising:
   a piezoelectric substrate having first and second acoustic tracks;
   a first interdigital transducer located on the first acoustic track;
   a second interdigital transducer, located on the first acoustic track, electrically and acoustically coupled in series to the first interdigital transducer, forming a series nodal connection;
   a third interdigital transducer, located on the second acoustic track, electrically connected to the series nodal connection and also shunted to ground potential; and
   said first and second interdigital transducers are electrically and acoustically independently tuned to operate at resonance at the passband center frequency $f_o$ while said shunt transducer is independently electrically tuned to operate at anti resonance at the passband center frequency $f_o$.

5. A SAW device as described in claim 4, wherein the first and second acoustic tracks have first and second ends and further comprise reflectors coupled to the first, second and third interdigital transducers at said first and second ends of the acoustic tracks.

6. A SAW filter operating over a frequency passband having a center frequency $f_o$, comprising:
   a piezoelectric substrate having a plurality of acoustic tracks;
   a plurality of transducers electrically and acoustically coupled in series on one of the acoustic tracks, forming series connected transducers operating at resonant frequency at $f_o$;
   a plurality of shunt transducers each electrically coupled to ground potential between each of the series connected transducers on at least one other acoustic track, and operating at anti resonant frequency at $f_o$; and
   the acoustic coupling and the electrical coupling are independently tuned to control the bandwidth and insertion loss of the SAW filter.

7. A SAW device as described in claim 6, wherein the acoustic tracks have first and second ends and further comprise reflectors acoustically coupled to the plurality of transducers at said first and second ends of the acoustic tracks.

8. A method for minimizing acoustic losses in a SAW device having acoustic tracks and resonant and anti resonant transducers on a piezoelectric substrate, comprising the steps of:
   combining like transducers on separate acoustic tracks onto common tracks with like transducers, including the steps of:
   combining like resonant transducers into one acoustic track forming adjacent resonant transducers;
   electrically and acoustically coupling in series the adjacent resonant transducers;
   combining like anti resonant transducers into at least one other acoustic track;
   electrically coupling the anti resonant transducers to the series connected resonant transducers such that a shunt transducer is formed between each series connection of the resonant transducers, thereby providing for the propagation of acoustic energy between series adjacent resonant transducers and the propagation of acoustic energy between adjacent anti resonant transducers;
   independently adjusting the electrical and acoustical coupling of adjacent resonant transducers to control resonance: and independently adjusting the electrical and acoustic coupling of adjacent anti resonant transducers to control anti resonance.

9. A SAW filter operating over a predetermined frequency passband having a center frequency $f_o$, comprising:
   a piezoelectric substrate having acoustic tracks;
   a plurality of interdigital transducers electrically and acoustically coupled in series on a common acoustic track, forming a series nodal connection between adjacent series coupled interdigital transducers, and each series coupled transducer operating at a same resonant frequency at $f_o$ within the passband;
   a plurality of shunt interdigital transducers, each electrically coupled to one series nodal connection on at least one other acoustic track, each shunt interdigital transducer operating at a same anti resonant frequency at $f_o$ within the passband; and
   the electrical and acoustical coupling are independently controlled to adjust the predetermined frequency passband.

10. A SAW device as described in claim 9, wherein each series interdigital transducers has a pitch and beam width and all of the series interdigital transducers on the common acoustic track have substantially the same pitch and substantially the same beam width.

11. A SAW device as described in claim 10, wherein each shunt interdigital transducer has a pitch and beam width and the shunt interdigital transducers on any given acoustic track have substantially the same pitch and substantially the same beam width.

12. A SAW filter as described in claim 11, wherein the acoustical coupling is controlled by varying the beam width of the adjacent series and adjacent shunt interdigital transducers.

13. A SAW filter as described in claim 9, wherein the series nodal connection between series transducers is formed by connecting opposite electrodes between series transducers on one acoustic track, and the electrical coupling for the shunt transducers is formed by connecting the series nodal connection to the first electrode of the shunt transducer on a second acoustic track, the second electrode of the shunt transducer being connected to ground potential.

14. A SAW filter as described in claim 9, wherein the series nodal connection between series transducers is formed by connecting the first electrode of one transducer to the first electrode of the adjacent transducer, the next series nodal connection is formed by connecting the second electrode of the adjacent transducer to the second electrode of the following adjacent transducer, and continually altering this connection across the acoustic track, the electrical coupling for the shunt transducers is formed by connecting each of the series nodal connections to each of the electrodes of the shunt transducers located on two acoustic tracks.

15. A surface acoustic wave (SAW) device operating over a frequency passband having a center frequency $f_o$, comprising:

a piezoelectric substrate including acoustic tracks;

a first series transducer having first and second opposite electrode bus bars, and including electrode fingers extending from each of the first and second opposite electrode bus bars such that the electrode fingers extending from the first and second opposite electrode bus bars are interdigitated;

a second series transducer having first and second opposite electrode bus bars and including electrode fingers extending from each of the first and second opposite electrode bus bars such that the electrode fingers extending from the first and second opposite electrode bus bars are interdigitated;

said first and second transducers being electrically and acoustically coupled in series on a common acoustic track and operating at resonant frequency at $f_o$;

a shunt transducer operating at anti resonant frequency electrically coupled between the first and second transducers and having first and second opposite electrode bus bars on a second common acoustic track and including electrode fingers extending from each of the first and second opposite electrode bus bars such that the electrode fingers extending from the first and second opposite electrode bus bars are interdigitated;

said shunt transducer operating at anti resonant frequency at $f_o$; and the electrical coupling between said first and second series transducers is formed by deposing ¾ wavelength electrode finger to form the last electrode finger of the first transducer and the first finger of the second transducer.

16. A surface acoustic wave device as described in claim 15, further comprising:

a second shunt transducer electrically coupled to the second series transducer and also coupled to ground potential;

a third series transducer electrically connected in series with the second series transducer on the common acoustic track;

a third shunt transducer electrically coupled to the third series transducer on the second acoustic track;

a fourth series transducer electrically coupled in series with the third series transducer in the first acoustic track; and said first and second series transducers acoustically and electrically tuned with said third and fourth series transducers and said first, second, and third shunt transducers electrically and acoustically tuned.

17. A surface wave acoustic device as described in claim 15, further comprising reflector pairs, coupled to the series and shunt transducers at the ends of the common acoustic track and the second common acoustic track.

18. A method for reducing insertion loss in a SAW filter having interdigital transducers and acoustic tracks, comprising the steps of:

determining a frequency passband having a center frequency $f_o$;

electrically and acoustically coupling the interdigital transducers in series on a common acoustic track to form adjacent series transducers;

electrically coupling shunt transducers between the series connection to form adjacent shunt transducers on at least one other common acoustic track;

independently electrically and acoustically tuning the series transducers for series resonance at $f_o$;

independently electrically and acoustically tuning the shunt transducers for anti resonance at $f_o$;

transferring acoustic energy between adjacent series transducers; and transferring acoustic energy between adjacent shunt transducers.

19. A communication device, comprising:

a receiver for receiving a communication signal, the receiver including a surface acoustic wave (SAW) device, comprising:
a piezoelectric film having at least two opposing acoustic tracks;
a plurality of interdigital transducers deposited on the at least two opposing acoustic tracks;
the plurality of interdigital transducers located on one of the acoustic tracks are electrically and acoustically coupled in series;
the plurality of interdigital transducers located on the at least one other acoustic track are shunted between the series connection of the opposing track and ground potential; and
the interdigital transducers on the at least one common track are independently electrically and acoustically tuned for resonant frequency at $f_o$ while the at least one shunt transducer is independently electrically and acoustically tuned for anti resonant frequency at $f_o$.

20. A communications device as described in claim 19, wherein the acoustic tracks have first and second ends and further comprising a reflector pair acoustically coupled to each acoustic track, the reflector pair divided such that one reflector is located adjacent to one of the interdigital transducers at one end of the acoustic track while the second reflector is located adjacent to another interdigital transducer at the opposite end of the acoustic track.

* * * * *